US011394421B2

(12) United States Patent
Yamaguchi

(10) Patent No.: US 11,394,421 B2
(45) Date of Patent: Jul. 19, 2022

(54) RADIO FREQUENCY MODULE AND COMMUNICATION DEVICE

(71) Applicant: Murata Manufacturing Co., Ltd., Nagaokakyo (JP)

(72) Inventor: Yukiya Yamaguchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/227,376

(22) Filed: Apr. 12, 2021

(65) Prior Publication Data

US 2021/0336647 A1 Oct. 28, 2021

(30) Foreign Application Priority Data

Apr. 23, 2020 (JP) .............................. JP2020-076983

(51) Int. Cl.
| | |
|---|---|
| *H04B 1/40* | (2015.01) |
| *H03F 3/24* | (2006.01) |
| *H03F 1/56* | (2006.01) |
| *H01L 23/66* | (2006.01) |
| *H04B 1/04* | (2006.01) |

(52) U.S. Cl.
CPC .............. *H04B 1/40* (2013.01); *H01L 23/66* (2013.01); *H03F 1/565* (2013.01); *H03F 3/245* (2013.01); *H01L 2223/6655* (2013.01); *H03F 2200/222* (2013.01); *H03F 2200/294* (2013.01); *H03F 2200/451* (2013.01); *H04B 2001/0408* (2013.01)

(58) Field of Classification Search
CPC ... H04B 1/40; H04B 2001/0408; H01L 23/66; H01L 2223/6655; H03F 1/565; H03F 3/245; H03F 2200/222; H03F 2200/294; H03F 2200/451
See application file for complete search history.

(56) References Cited

U.S. PATENT DOCUMENTS

| | | | |
|---|---|---|---|
| 9,633,349 B1 * | 4/2017 | Yeh ......................... H01L 23/66 |
| 10,643,962 B1 * | 5/2020 | Ichitsubo .................. H03F 3/72 |
| 2006/0290423 A1 * | 12/2006 | Ichitsubo .................. H03F 1/30 330/126 |
| 2018/0374789 A1 * | 12/2018 | Chang ..................... H01L 23/50 |

FOREIGN PATENT DOCUMENTS

WO 2012/033885 A1 3/2012

\* cited by examiner

*Primary Examiner* — Nguyen T Vo
(74) *Attorney, Agent, or Firm* — Xsensus LLP

(57) ABSTRACT

A radio frequency module includes: a first power amplifier and a second power amplifier on a first principal surface of a module board; external-connection terminals on a second principal surface; and a first via-conductor and a second via-conductor apart from each other inside of the board. One end of the first via-conductor is connected to a ground electrode of the first power amplifier, and the other end is connected to a first external-connection terminal. One end of the second via-conductor is connected to a ground electrode of the second power amplifier, and the other end is connected to a second external-connection terminal. The second via-conductor penetrates the board in a normal direction of the first principal surface, and the first via-conductor includes columnar conductors cascaded with central axes thereof displaced in the normal direction and has no region where the columnar conductors overlap in a plan view of the board.

20 Claims, 7 Drawing Sheets

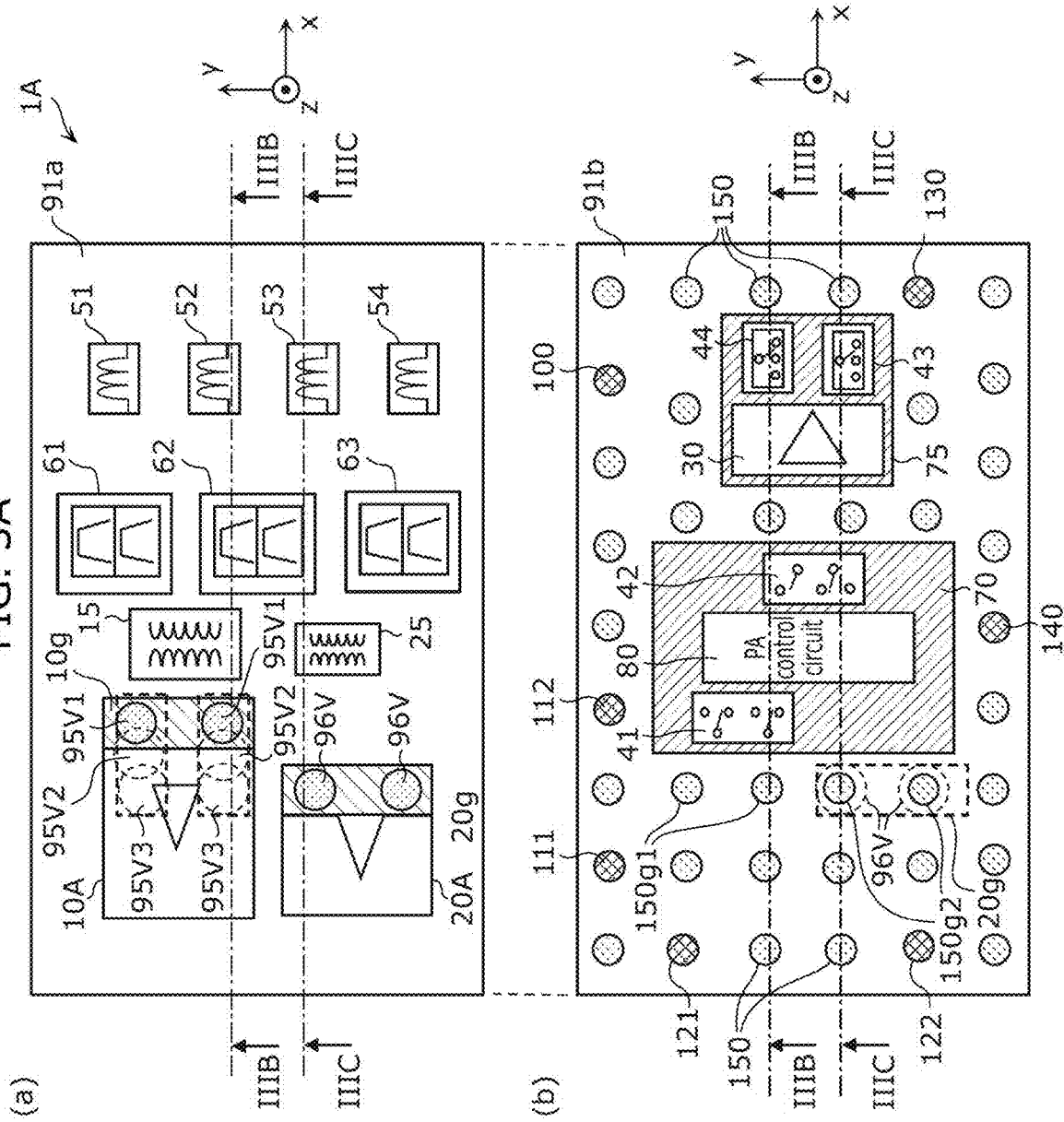

RADIO FREQUENCY MODULE AND COMMUNICATION DEVICE

CROSS REFERENCE TO RELATED APPLICATION

The present application is based on and claims priority to Japanese Patent Application No. 2020-076983 filed on Apr. 23, 2020. The entire disclosure of the above-identified application, including the specification, drawings and claims is incorporated herein by reference in its entirety.

TECHNICAL FIELD

The present disclosure relates to a radio frequency module and a communication device.

BACKGROUND

In mobile communication devices such as mobile phones, the number of circuit elements included in radio frequency front-end circuits increases with the progress particularly in multiband communications.

WO2012/33885 discloses a radio frequency module (electronic component module) in which electronic components included in the radio frequency front-end circuit are mounted on both surfaces of the circuit board. The electronic components mounted on the circuit board are covered with encapsulation resin layers, on a surface of which connection terminals (pad electrodes) are located. An external board is connected through such connection terminals.

SUMMARY

Technical Problems

To apply the radio frequency module disclosed in WO2012/33885 to a multiband-capable radio frequency front-end circuit, it is necessary to dissipate heat generated by electronic components mounted on the circuit board by some means corresponding to signal paths through which signals in communication bands are transferred.

However, as recognized by the present inventor, heat generated by electronic components, when large in amount, is transferred via the circuit board to electronic components mounted on the opposite surface and also transferred among electronic components provided for the respective communication bands. This results in the degradation in the properties of the radio frequency module.

The present disclosure has been conceived to solve the above problem, as well as other problems, and its aim is to provide a radio frequency module and a communication device that are multiband-capable and have enhanced heat dissipation properties.

Solutions

To achieve the above aim, and other objectives, the radio frequency module according to an aspect of the present disclosure includes: a module board including a first principal surface and a second principal surface on opposite sides of the module board; a first power amplifier that is disposed on the first principal surface and amplifies a transmission signal in a first frequency range; a second power amplifier that is disposed on the first principal surface and amplifies a transmission signal in a second frequency range that is different from the first frequency range; a plurality of external-connection terminals disposed on the second principal surface; a first via-conductor located inside of the module board and connecting the first principal surface and the second principal surface; and a second via-conductor located inside of the module board and connecting the first principal surface and the second principal surface. In this radio frequency module, the first via-conductor and the second via-conductor are spaced apart from each other inside of the module board. One end of the first via-conductor on the first principle surface side is connected to a first ground electrode of the first power amplifier, and a remaining end of the first via-conductor on the second principal surface side is connected to a first external-connection terminal set at ground potential, the first external-connection terminal being one of the plurality of external-connection terminals. One end of the second via-conductor on the first principal surface side is connected to a second ground electrode of the second power amplifier, and a remaining end of the second via-conductor on the second principal surface is connected to a second external-connection terminal set at ground potential, the second external-connection terminal being one of the plurality of external-connection terminals. The second via-conductor penetrates the module board in a normal direction that is normal to the first principal surface. The first via-conductor includes a plurality of first columnar conductors extending in the normal direction of the first principal surface and has no region in which the plurality of first columnar conductors overlap each other in a plan view of the module board, the plurality of first columnar conductors being cascaded with central axes of the plurality of first columnar conductors being displaced in the normal direction.

Advantageous Effects

The present disclosure provides a radio frequency module and a communication device that are multiband-capable and have enhanced heat dissipation properties.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 3A is a schematic plan view of the configuration of a radio frequency module according to a working example of the embodiment.

DESCRIPTION OF EMBODIMENT

Figure 1:
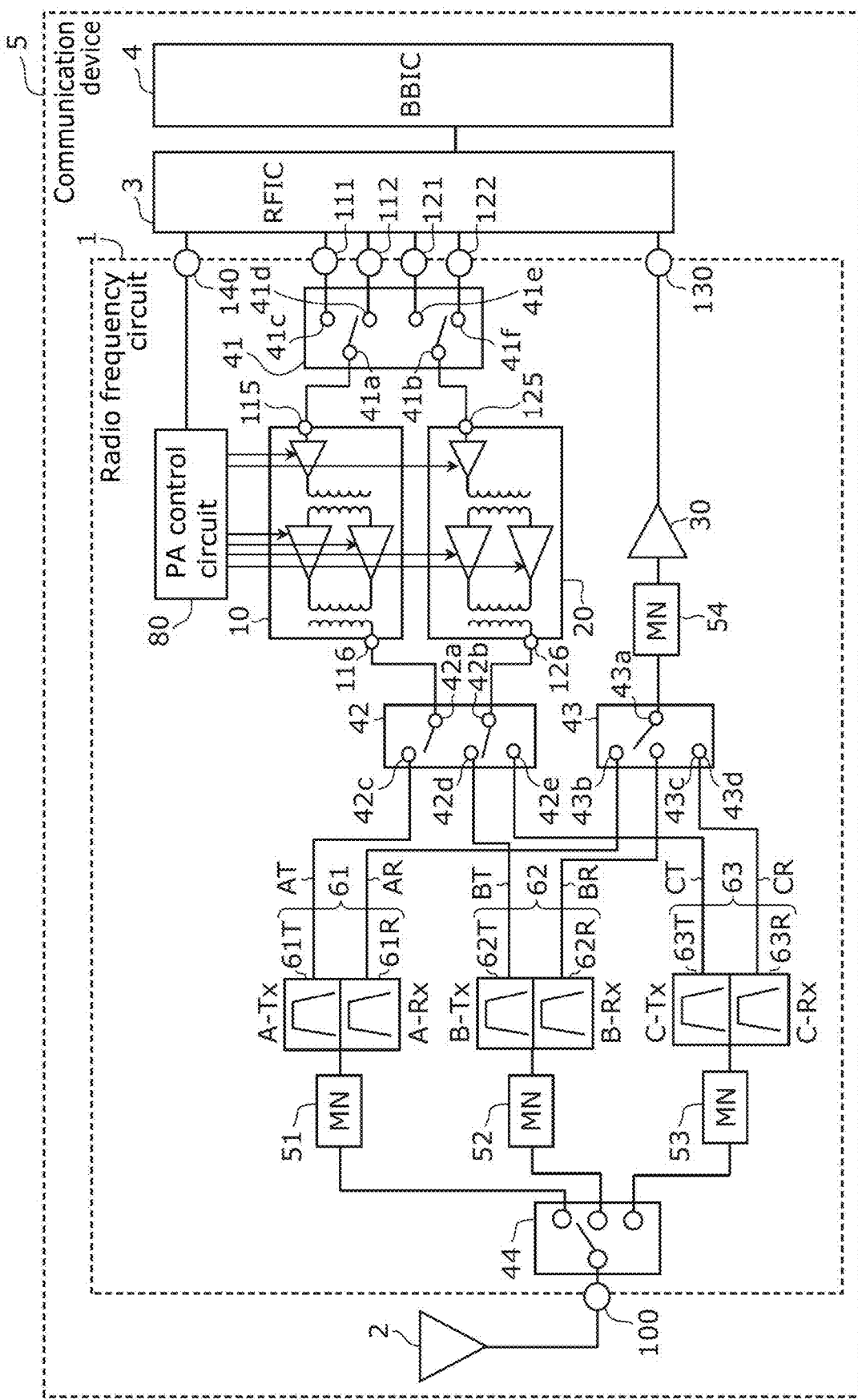
FIG. 1 is a diagram showing the circuit configurations of a radio frequency module (or RF front-end circuitry) and a communication device according to an embodiment.

The following describes in detail the embodiment according to the present disclosure with reference to the drawings.

Note that the following embodiment shows a comprehensive or specific example of the present disclosure. The numerical values, shapes, materials, structural elements, the arrangement and connection of the structural elements, etc. shown in the following embodiment are mere examples, and thus are not intended to limit the present disclosure. Of the structural elements described in the following working example and variation, structural elements not recited in any one of the independent claims are described as optional structural elements. Also, the size of the structural elements and the size ratio thereof shown in the drawings are not necessarily exact. In the drawings, substantially the same structural elements are assigned the same reference marks, and their repetitive description may be omitted or simplified.

In the following description, terms that represent the relationship between elements (e.g., "parallel" and "vertical"), terms that represent the shape of an element (e.g., "rectangular"), and a range of numerical values indicate not only the exact meanings of the terms, but also substantially equivalent scopes of the terms. For example, such terms include the meaning of a few percent of error.

In the following description of A, B, and C mounted on a board, "in a plan view of the board (or "in a plan view of a principal surface of the board"), C is disposed between A and B" means that at least one of the lines that connect a point in A and a point in B in a plan view of the board passes through the region of C. Also, "in a plan view of the board" means a view of the board and the circuit elements mounted on the board orthographically projected onto a plane that is parallel to a principal surface of the board.

Also, in the following description, "transmission path" means a transmission line that includes wiring through which a radio frequency transmission signal propagates, an electrode directly connected to the wiring, a terminal directly connected to the wiring or the electrode, and so forth. Also, "reception path" means a transmission line that includes wiring through which a radio frequency reception signal propagates, an electrode directly connected to the wiring, a terminal directly connected to the wiring or the electrode, and so forth. Also, "transmission/reception path" means a transmission line that includes wiring through which a radio frequency transmission signal and a radio frequency reception signal propagate, an electrode directly connected to the wiring, a terminal directly connected to the wiring or the electrode, and so forth.

Embodiment

1. Circuit Configurations of Radio Frequency Module 1 and Communication Device 5

FIG. 1 is a diagram showing the circuit configurations of radio frequency module 1 and communication device 5 according to the embodiment. As shown in the drawing, communication device 5 includes radio frequency module 1, antenna 2, radio frequency (RF) signal processing circuit (RFIC) 3, and baseband signal processing circuit (BBIC) 4.

RFIC 3 is an RF signal processing circuit that processes a radio frequency signal that is to be transmitted or has been received by antenna 2. More specifically, RFIC 3 performs signal processing, such as down-conversion, on a reception signal input via a reception path of radio frequency module 1, and outputs the resulting reception signal to BBIC 4. RFIC 3 also performs signal processing, such as up-conversion, on a transmission signal input from BBIC 4, and outputs the resulting transmission signal to a transmission path of radio frequency module 1.

BBIC 4 is a circuit that performs signal processing by use of an intermediate frequency range, the frequency of which is lower than that of a radio frequency signal transferred by radio frequency module 1. A signal processed by BBIC 4 is used, for example, as an image signal for image display, or as a sound signal for telephone conversation through a speaker.

RFIC 3 also serves as a controller that controls the connections of switches 41, 42, 43, and 44 included in radio frequency module 1, on the basis of a communication band (frequency range) to be used. More specifically, RFIC 3 switches between connecting switches 41 through 44 included in radio frequency module 1 by a control signal (not illustrated). More specifically, RFIC 3 outputs, to power amplifier (PA) control circuit 80, a digital control signal for controlling switches 41 through 44. PA control circuit 80 of radio frequency module 1 outputs a digital control signal to switches 41 through 44 in response to the digital control signal input from RFIC 3, thereby controlling the connection and disconnection of switches 41 through 44.

RFIC 3 also serves as a controller that controls the gains of transmission amplification circuits 10 and 20 included in radio frequency module 1, and power-supply voltage Vcc and bias voltage Vbias supplied to transmission amplification circuits 10 and 20. More specifically, RFIC 3 outputs a digital control signal to control signal terminal 140 of radio frequency module 1. PA control circuit 80 of radio frequency module 1 outputs a control signal, and power-supply voltage Vcc or bias voltage Vbias to transmission amplification circuits 10 and 20 in response to the digital control signal input via control signal terminal 140, thereby controlling the gains of transmission amplification circuits 10 and 20. Note that different control signal terminals may be used for receiving, from RFIC 3, a digital control signal for controlling the gains of transmission amplification circuits 10 and 20 and for receiving, from RFIC 3, a digital control signal for controlling power-supply voltage Vcc and bias voltage Vbias supplied to transmission amplification circuits 10 and 20. Note that the controller may be provided outside of RFIC 3, and thus may be provided, for example, in BBIC 4.

Antenna 2 is connected to antenna connection terminal 100 of radio frequency module 1. Antenna 2 radiates a radio frequency signal output from radio frequency module 1. Antenna 2 also receives a radio frequency signal from outside, and outputs the received radio frequency signal to radio frequency module 1.

Note that antenna 2 and BBIC 4 are not essential (i.e., optional features) structural elements of communication device 5 according to the present embodiment.

The following describes a detailed configuration of radio frequency module 1.

As shown in FIG. 1, radio frequency module 1 includes antenna connection terminal 100, transmission amplification circuits 10 and 20, low-noise amplifier 30, transmission filters 61T, 62T, and 63T, reception filters 61R, 62R, and 63R, PA control circuit 80, matching circuits 51, 52, 53, and 54, and switches 41, 42, 43, and 44.

Antenna connection terminal 100 is a common antenna terminal connected to antenna 2.

Transmission amplification circuit 10 is a differential amplifier circuit that amplifies transmission signals in communication band A and communication band B input from transmission input terminals 111 and 112. Note that instead of transmission amplification circuit 10, radio frequency module 1 may include a first transmission amplification circuit that amplifies a radio frequency signal in communication band A and a second transmission amplification circuit that amplifies a radio frequency signal in communication band B.

Transmission amplification circuit 20 is a differential amplifier circuit that amplifies transmission signals in communication band C input from transmission input terminals 121 and 122.

PA control circuit 80 adjusts the gains of the amplification elements included in transmission amplification circuits 10 and 20 by a digital control signal input via control signal terminal 140. PA control circuit 80 may be implemented as a semiconductor integrated circuit (IC). The semiconductor IC has, for example, a complementary metal oxide semiconductor (CMOS) structure. More specifically, the semiconductor IC is fabricated by a silicon on insulator (SOI) process. This enables a low-cost manufacture of the semiconductor IC. Note that the semiconductor IC may include at least one of GaAs, SiGe, or GaN. This enables the output of radio frequency signals having high quality amplification properties and noise characteristics.

Low-noise amplifier 30 is an amplifier that performs low-noise amplification on radio frequency signals in communication bands A, B, and C, and outputs the resulting signals to reception output terminal 130. Note that radio frequency module 1 may include a plurality of low-noise amplifiers. For example, radio frequency module 1 may include a first low-noise amplifier that amplifies radio frequency signals in communication bands A and B, and a second low-noise amplifier that amplifies radio frequency signals in communication band C.

In the present embodiment, communication bands A and B are located at a lower frequency side than communication band C. Communication bands A and B are communication bands that belong to, for example, the middle band group (1.45-2.2 GHz), and communication band C is a communication band that belongs to, for example, the high band group (2.3-2.7 GHz). Note, however, that the relationship between communication bands A and B and communication band C in terms of higher or lower in the frequencies is not limited to the foregoing relationship. Communication bands A and B may thus be located at a higher frequency side than commination band C. Note that the middle band group is an example of the first frequency range, and communication band C is an example of the second frequency range that is different from the first frequency range.

Transmission filter 61T is disposed in transmission path AT that connects transmission input terminals 111 and 112 with antenna connection terminal 100. Transmission filter 61T passes a transmission signal in the transmission band of communication band A, among transmission signals amplified by transmission amplification circuit 10. Transmission filter 62T is disposed in transmission path BT that connects transmission input terminals 111 and 112 with antenna connection terminal 100. Transmission filter 62T passes a transmission signal in the transmission band of communication band B, among transmission signals amplified by transmission amplification circuit 10. Transmission filter 63T is disposed in transmission path CT that connects transmission input terminals 121 and 122 with antenna connection terminal 100. Transmission filter 63T passes a transmission signal in the transmission band of communication band C, among transmission signals amplified by transmission amplification circuit 20.

Reception filter 61R is disposed in reception path AR that connects reception output terminal 130 with antenna connection terminal 100. Reception filter 61R passes a reception signal in the reception band of communication band A, among reception signals input from antenna connection terminal 100. Reception filter 62R is disposed in reception path BR that connects reception output terminal 130 with antenna connection terminal 100. Reception filter 62R passes a reception signal in the reception band of communication band B, among reception signals input from antenna connection terminal 100. Reception filter 63R is disposed in reception path CR that connects reception output terminal 130 with antenna connection terminal 100. Reception filter 63R passes a reception signal in the reception band of communication band C, among reception signals input from antenna connection terminal 100.

Transmission filter 61T and reception filter 61R are included in duplexer 61, the passband (e.g., the passband defined by a 3 dB bandwidth) of which is communication band A. Duplexer 61 transfers a transmission signal and a reception signal in communication band A using Frequency Division Duplex (FDD). Transmission filter 62T and reception filter 62R are included in duplexer 62, the passband of which is communication band B. Duplexer 62 transfers a transmission signal and a reception signal in communication band B using FDD. Transmission filter 63T and reception filter 63R are included in duplexer 63, the passband of which is communication band C. Duplexer 63 transfers a transmission signal and a reception signal in communication band C using FDD.

Note that duplexers 61 through 63 may each be a multiplexer including only a plurality of transmission filters, a multiplexer including only a plurality of reception filters, or a multiplexer including a plurality of duplexers. Also note that transmission filter 61T and reception filter 61R may not be included in duplexer 61, and thus may be a single filter that transfers signals using Time Division Duplex (TDD). In this case, a switch that switches between transmission and reception is disposed in at least one of the previous stage or the subsequent stage of such single filter. Similarly, transmission filter 62T and reception filter 62R may not be included in duplexer 62, and thus may be a single filter that transfers signals using TDD. Similarly, transmission filter 63T and reception filter 63R may not also be included in duplexer 63, and thus may be a single filter that transfers signals using TDD.

Matching circuit 51 is disposed in a path that connects switch 44 and duplexer 61. Matching circuit 51 matches the impedances of switch 44 and antenna 2 to the impedance of duplexer 61. Matching circuit 52 is disposed in a path that connects switch 44 and duplexer 62. Matching circuit 52 matches the impedances of switch 44 and antenna 2 to the impedance of duplexer 62. Matching circuit 53 is disposed in a path that connects switch 44 and duplexer 63. Matching circuit 53 matches the impedances of switch 44 and antenna 2 to the impedance of duplexer 63.

Matching circuit 54 is disposed in a reception path that connects low-noise amplifier 30 and switch 43. Matching circuit 54 matches the impedance of low-noise amplifier 30 to the impedances of switch 43 and duplexers 61 through 63.

Switch 41 includes common terminals 41*a* and 41*b*, and selection terminals 41*c*, 41*d*, 41*e*, and 41*f*. Common terminal 41*a* is connected to input terminal 115 of transmission amplification circuit 10. Common terminal 41*b* is connected to input terminal 125 of transmission amplification circuit 20. Selection terminal 41*c* is connected to transmission input terminal 111, selection terminal 41*d* to transmission input terminal 112, selection terminal 41*e* to transmission input terminal 121, and selection terminal 41*f* to transmission input terminal 122. Switch 41 is a switch disposed at the side of the input terminals of transmission amplification circuits 10 and 20. Having such connection structure, switch 41 switches between connecting transmission amplification circuit 10 and transmission input terminal 111 and connecting transmission amplification circuit 10 and transmission input terminal 112, and switches between connecting transmission amplification circuit 20 and transmission input terminal 121 and connecting transmission amplification circuit 20 and transmission input terminal 122. Switch 41 is implemented, for example, as a double pole 4 throw (DP4T) switch circuit.

Note that switch 41 may also be implemented as a switch that includes: a single pole double throw (SPDT) switch having common terminal 41a, and selection terminals 41c and 41d; and an SPDT switch having common terminal 41b, and selection terminals 41e and 41f.

Input through transmission input terminal 111 is, for example, a transmission signal in communication band A, and input through transmission input terminal 112 is, for example, a transmission signal in communication band B. Also, input through transmission input terminals 121 and 122 are, for example, transmission signals in communication band C.

Alternatively, input through transmission input terminal 111 may be, for example, a transmission signal in communication band A or B of the Fourth Generation Mobile Communications System (4G) and input through transmission input terminal 112 may be, for example, a transmission signal in communication band A or B of the Fifth Generation Mobile Communications System (5G). Also, input through transmission input terminal 121 may be, for example, a transmission signal in communication band C of 4G, and input through transmission input terminal 122 may be, for example, a transmission signal in communication band C of 5G.

Alternatively, switch 41 may be an SPDT switch circuit in which the common terminal is connected to one of transmission input terminals 111, 112, 121, and 122 (such one of the selection terminals is referred to as first transmission input terminal) and one of the selection terminals is connected to input terminal 115 of transmission amplification circuit 10 and the other of the selection terminals is connected to input terminal 125 of transmission amplification circuit 20.

In this case, for example, a transmission signal in one of communication bands A, B, and C is selectively input from the first transmission input terminal. Switch 41 switches between connecting the first transmission input terminal and transmission amplification circuit 10 and connecting the first transmission input terminal and transmission amplification circuit 20, in accordance with the transmission signal having been input. Alternatively, for example, a 4G transmission signal and a 5G transmission signal may be input from the first transmission input terminal. Switch 41 switches between connecting the first transmission input terminal and transmission amplification circuit 10 and connecting the first transmission input terminal and transmission amplification circuit 20, in accordance with the transmission signals having been input.

Switch 41 may also be implemented as a double pole double throw (DPDT) switch circuit having two common terminals and two selection terminals. In this case, the first transmission input terminal is connected to one of the common terminals, and a second transmission input terminal is connected to the other of the common terminals. Also, one of the selection terminals is connected to transmission amplification circuit 10, and the other of the selection terminals is connected to transmission amplification circuit 20. Having such connection structure, switch 41 switches between connecting one of the common terminals and one of the selection terminals and connecting one of the common terminals and the other of the selection terminals. Switch 41 also switches between connecting the other of the common terminals and one of the selection terminals and connecting the other of the common terminals and the other of the selection terminals.

In this case, for example, a transmission signal in communication band A or B is input from the first transmission input terminal, and a transmission signal in communication band C is input from the second transmission input terminal. Alternatively, for example, a 4G transmission signal may be input from the first transmission input terminal, and a 5G transmission signal may be input from the second transmission input terminal.

Switch 42 includes common terminals 42a and 42b, and selection terminals 42c, 42d, and 42e. Common terminal 42a is connected to output terminal 116 of transmission amplification circuit 10. Common terminal 42b is connected to output terminal 126 of transmission amplification circuit 20. Selection terminal 42c is connected to transmission filter 61T, selection terminal 42d to transmission filter 62T, sand selection terminal 42e to transmission filter 63T. Switch 42 is a switch disposed at the side of the output terminals of transmission amplification circuits 10 and 20. Having such connection structure, switch 42 switches between connecting transmission amplification circuit 10 and transmission filter 61T and connecting transmission amplification circuit 10 and transmission filter 62T, and switches between connecting and disconnecting transmission amplification circuit 20 and transmission filter 63T. Switch 42 is implemented, for example, as a double pole 3 throw (DP3T) switch circuit.

Note that switch 42 may also be implemented as a switch that includes: an SPDT switch having common terminal 42a, and selection terminals 42c and 42d; and a single pole single throw (SPST) switch having common terminal 42b and selection terminal 42e.

Switch 43 includes common terminal 43a, and selection terminals 43b, 43c, and 43d. Common terminal 43a is connected to the input terminal of low-noise amplifier 30 via matching circuit 54. Selection terminal 43b is connected to reception filter 61R, selection terminal 43c to reception filter 62R, and selection terminal 43d to reception filter 63R. Having such connection structure, switch 43 switches between connecting and disconnecting low-noise amplifier 30 and reception filter 61R, connecting and disconnecting low-noise amplifier 30 and reception filter 62R, and connecting and disconnecting low-noise amplifier 30 and reception filter 63R. Switch 43 may be implemented, for example, as a single pole 3 throw (SP3T) switch circuit.

Switch 44, which is an exemplary antenna switch, is connected to antenna connection terminal 100. Switch 44 switches a connection of antenna connection terminal 100 between (1) transmission path AT and reception path AR, (2) transmission path BT and reception path BR, and (3) transmission path CT and reception path CR. Note that switch 44 is implemented as a multi-connection switch circuit capable of simultaneous connections of at least two of (1) through (3).

Note that non-limiting examples of each of the foregoing transmission filters 61T through 63T and reception filters 61R through 63R include an acoustic wave filter utilizing surface acoustic wave (SAW), an acoustic wave filter utilizing bulk acoustic wave (BAW), an LC resonant filter, and a dielectric filter.

Also, matching circuits 51 through 54 are not essential structural elements of the radio frequency module according to the present disclosure.

A matching circuit may be disposed between transmission amplification circuit 10 and switch 42, and between transmission amplification circuit 20 and switch 42. Also, a diplexer and a coupler, etc. may be disposed between antenna connection terminal 100 and switch 44.

In the configuration of radio frequency module 1, transmission amplification circuit 10, switch 42, transmission filter 61T, matching circuit 51, and switch 44 are included in a first transmission circuit that transfers a transmission signal in communication band A toward antenna connection terminal 100. Also, switch 44, matching circuit 51, reception filter 61R, switch 43, matching circuit 54, and low-noise amplifier 30 are included in a first reception circuit that transfers a reception signal in communication band A from antenna 2 via antenna connection terminal 100.

Also, transmission amplification circuit 10, switch 42, transmission filter 62T, matching circuit 52, and switch 44 are included in a second transmission circuit that transfers a transmission signal in communication band B toward antenna connection terminal 100. Also, switch 44, matching circuit 52, reception filter 62R, switch 43, matching circuit 54, and low-noise amplifier 30 are included in a second reception circuit that transfers a reception signal in communication band B from antenna 2 via antenna connection terminal 100.

Also, transmission amplification circuit 20, switch 42, transmission filter 63T, matching circuit 53, and switch 44 are included in a third transmission circuit that transfers a transmission signal in communication band C toward antenna connection terminal 100. Also, switch 44, matching circuit 53, reception filter 63R, switch 43, matching circuit 54, and low-noise amplifier 30 are included in a third reception circuit that transfers a reception signal in communication band C from antenna 2 via antenna connection terminal 100.

Radio frequency module 1 with the above configuration is capable of at least one of transmission, reception, or transmission/reception of radio frequency signal(s) in one of communication band A, communication band B, and communication band C. Radio frequency module 1 with the above configuration is also capable of at least one of simultaneous transmission, simultaneous reception, or simultaneous transmission/reception of radio frequency signals in communication band A, communication band B, and communication band C.

Note that in the radio frequency module according to the present disclosure, the foregoing three transmission circuits and three reception circuits are not required to be connected to antenna connection terminal 100 via switch 44, and thus may be connected to antenna 2 via different terminals. Also note that the radio frequency module according to the present disclosure is simply required to include PA control circuit 80, the first transmission circuit and the third transmission circuit.

Also, in the radio frequency module according to the present disclosure, the first transmission circuit is simply required to include transmission amplification circuit 10, and the third transmission circuit is simply required to include transmission amplification circuit 20.

Low-noise amplifier 30, and at least one of switches 41, 42, 43, or 44 may be integrated in a single semiconductor IC. The semiconductor IC has, for example, a CMOS structure. More specifically, the semiconductor IC is fabricated by a SOI process. This enables a low-cost manufacture of the semiconductor IC. Note that the semiconductor IC may include at least one of GaAs, SiGe, or GaN. This enables the output of radio frequency signals having high quality amplification properties and noise characteristics.

Figure 2:
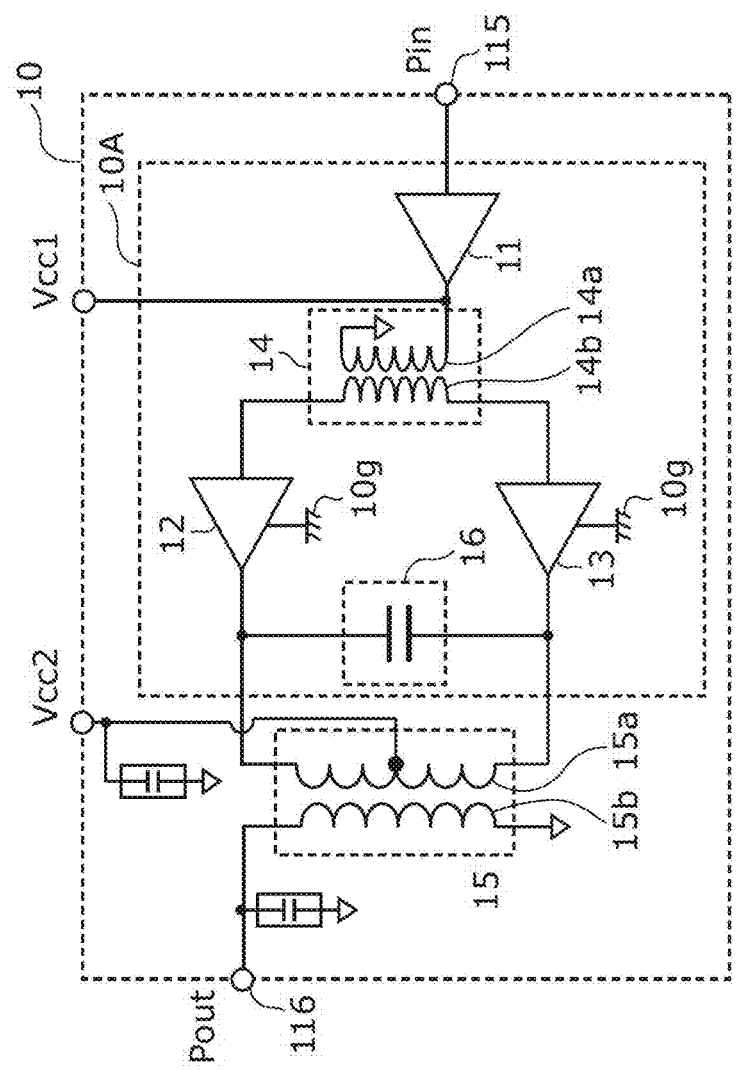
FIG. 2 is a diagram showing the circuit configuration of a transmission amplification circuit.

FIG. 2 is a diagram showing the circuit configuration of transmission amplification circuit 10 according to the embodiment. As shown in the drawing, transmission amplification circuit 10 includes: input terminal 115 and output terminal 116; amplification elements 12 (third amplification element) and 13 (fourth amplification element), and amplification element 11 (previous-stage amplification element); interstage transformer 14; capacitor 16; and output transformer (balun: balanced-to-unbalanced transformation element) 15. Amplification elements 11 through 13, interstage transformer 14, and capacitor 16 are included in power amplifier 10A. Power amplifier 10A is an example of the first power amplifier.

Interstage transformer 14 includes primary side coil 14a and secondary side coil 14b.

The input terminal of amplification element 11 is connected to input terminal 115, and the output terminal of amplification element 11 is connected to the unbalanced terminal of interstage transformer 14. One of the balanced terminals of interstage transformer 14 is connected to the input terminal of amplification element 12 and the other of the balanced terminals of interstage transformer 14 is connected to the input terminal of amplification element 13.

Amplification element 11 amplifies a radio frequency signal input from input terminal 115, with bias voltage Vcc1 being applied to amplification element 11. Subsequently, interstage transformer 14 performs unbalanced-to-balanced transformation on the resulting radio frequency signal. In so doing, one of the balanced terminals of interstage transformer 14 outputs a non-inverted input signal, and the other of the balanced terminals of interstage transformer 14 outputs an inverted input signal.

Output transformer 15, which is an exemplary first output transformer, includes primary side coil (first coil) 15a and secondary side coil (second coil) 15b. One end of primary side coil 15a is connected to the output terminal of amplification element 12, and the other end of primary side coil 15a is connected to the output terminal of amplification element 13. Also, bias voltage Vcc2 is supplied to the center point of primary side coil 15a. One end of secondary side coil 15b is connected to output terminal 116, and the other end of secondary side coil 15b is connected to the ground. Stated differently, output transformer 15 is connected between output terminal 116 and the output terminals of amplification elements 12 and 13.

Capacitor 16 is connected between the output terminal of amplification element 12 and the output terminal of amplification element 13.

Output transformer 15 and capacitor 16 transform the impedance of the non-inverted input signal amplified by amplification element 12 and the impedance of the inverted input signal amplified by amplification element 13 with the phases of these signals remaining reversed. Stated differently, output transformer 15 and capacitor 16 match the output impedance of power amplifier 10A at output terminal 116 to the input impedances of switch 42, and transmission filters 61T and 62T shown in FIG. 1. Note that the capacitance element connected between the ground and a path connecting output terminal 116 and secondary side coil 15b also contributes to the above impedance matching. Note that such capacitance element may be disposed in series in the path connecting output terminal 116 and secondary side coil 15b, or such capacitance element may not be included.

Here, amplification elements 11 through 13, interstage transformer 14, and capacitor 16 are included in power amplifier 10A. In many cases, amplification elements 11 through 13 and interstage transformer 14 are, for example, integrated in a single chip or mounted on the same board. In contrast, output transformer 15, which requires a high Q-value to support a high-power transmission signal, is not integrated with amplification elements 11 through 13, interstage transformer 14, and so forth. Stated differently, ones of the circuit components included in transmission amplification circuit 10 other than output transformer 15 are included in power amplifier 10A.

Note that amplification element 11 and capacitor 16 may not be included in power amplifier 10A.

In transmission amplification circuit 10 with the above configuration, amplification elements 12 and 13 operate in antiphase. Here, the fundamental wave currents from amplification elements 12 and 13 flow in antiphase; that is, in opposite directions. More specifically, the fundamental wave currents flow in the opposite directions, and thus do not flow toward the ground wiring and power-supply wiring that are disposed at equally distant positions from amplification elements 12 and 13. This configuration eliminates the necessity of considering the entry of unwanted currents into these wirings, and thus prevents the lowering of the power gain, which is observed in the conventional transmission amplification circuits. Also, the non-inverted signal and the inverted signal amplified by amplification elements 12 and 13 are synthesized, thereby cancelling out the noise components that are superimposed on these signals in a similar fashion. This configuration is thus capable of reducing unwanted waves such as, for example, radio frequency components.

Note that amplification element 11 is not an essential structural element of transmission amplification circuit 10. Also note that interstage transformer 14 is not the only means for transforming an unbalanced input signal into a non-inverted input signal and an inverted input signal. Also, capacitor 16 is not an essential structural element for impedance matching.

Although not illustrated in the drawings, transmission amplification circuit 20 has the same circuit configuration as that of transmission amplification circuit 10 shown in FIG. 2. Stated differently, transmission amplification circuit 20 includes: input terminal 125 and output terminal 126; amplification elements 22 (fifth amplification element) and 23 (sixth amplification element), and amplification element 21 (previous-stage amplification element); interstage transformer 24; capacitor 26; and output transformer (balun: balanced-to-unbalanced transformation element) 25. Amplification elements 21 through 23, interstage transformer 24, and capacitor 26 are included in power amplifier 20A. Power amplifier 20A is an example of the second power amplifier.

Interstage transformer 24 includes primary side coil 24a and secondary side coil 24b.

The input terminal of amplification element 21 is connected to input terminal 125, and the output terminal of amplification element 21 is connected to the unbalanced terminal of interstage transformer 24. One of the balanced terminals of interstage transformer 24 is connected to the input terminal of amplification element 22 and the other of the balanced terminals of interstage transformer 24 is connected to the input terminal of amplification element 23.

Output transformer 25, which is an exemplary second output transformer, includes primary side coil (third coil) 25a and secondary side coil (fourth coil) 25b. One end of primary side coil 25a is connected to the output terminal of amplification element 22, and the other end of primary side coil 25a is connected to the output terminal of amplification element 23. Also, bias voltage Vcc2 is supplied to the center point of primary side coil 25a. One end of secondary side coil 25b is connected to output terminal 126, and the other end of primary side coil 25b is connected to the ground. Stated differently, output transformer 25 is connected between output terminal 126 and the output terminals of amplification elements 22 and 23.

Capacitor 26 is connected between the output terminal of amplification element 22 and the output terminal of amplification element 23.

Here, amplification elements 21 through 23, interstage transformer 24, and capacitor 26 are included in power amplifier 20A. In many cases, amplification elements 21 through 23 and interstage transformer 24 are, for example, integrated in a single chip or mounted on the same board. In contrast, output transformer 25 is not integrated with amplification elements 21 through 23, interstage transformer 24, and so forth.

Note that amplification element 21 and capacitor 26 may not be included in power amplifier 20A.

The circuit configuration of transmission amplification circuit 20 prevents the lowering of the power gain, which is observed in the conventional transmission amplification circuits. Also, the non-inverted signal and the inverted signal amplified by amplification elements 22 and 23 are synthesized, thereby cancelling out the noise components that are superimposed on these signals in a similar fashion. This configuration is thus capable of reducing unwanted waves such as, for example, radio frequency components.

Note that amplification element 21 is not an essential structural element of transmission amplification circuit 20. Also note that interstage transformer 24 is not the only means for transforming an unbalanced input signal into a non-inverted input signal and an inverted input signal. Also, capacitor 26 is not an essential structural element for impedance matching.

Low-noise amplifier 30, and amplification elements 11 through 13, and 21 through 23 may be implemented, for example, as a field effect transistor (FET) or a heterojunction bipolar transistor (HBT) that includes CMOS or GaAs.

Note that transmission amplification circuit 10 may not include a differential power amplifier 10A, and thus may be an amplifier, including single-end amplification elements, where an unbalanced signal serves an input signal and an unbalanced signal as an output signal. Also, transmission amplification circuit 20 may not include a differential power amplifier 20A, and thus may be an amplifier, including single-end amplification elements, where an unbalanced signal serves as an input signal and an unbalanced signal as an output signal.

In radio frequency module 1 with the above configuration, transmission amplification circuit 10 amplifies transmission signals in communication bands A and B, and transmission amplification circuit 20 amplifies transmission signals in communication band C. Stated differently, the amplification properties of transmission amplification circuits 10 and 20 are optimized in specific frequency ranges (communication bands), and thus radio frequency module 1 requires a plurality of transmission amplification circuits for the respective frequency ranges (communication bands). A power amplifier included in a transmission amplification circuit is a component that generates a great amount of heat among the electronic components included in radio frequency module 1. As such, an increase in the number of power amplifiers included in a radio frequency module with the progress in multiband communications can result in an increase in the amount of heat generated by the power amplifiers and thus in the degradation in the properties of the radio frequency module.

In view of such concerns, the following describes the configuration of a small-sized, multiband-capable radio frequency module 1 having enhanced heat dissipation properties.

Figure 3B:
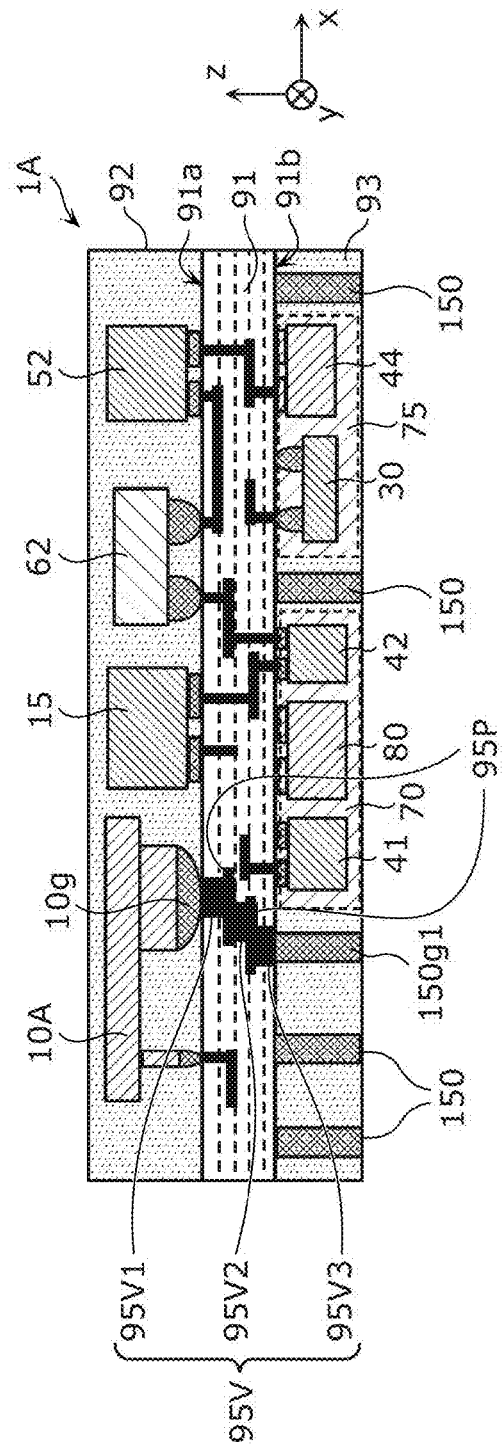
FIG. 3B is a first schematic cross-sectional view of the configuration of the radio frequency module according to the working example.
Figure 3C:
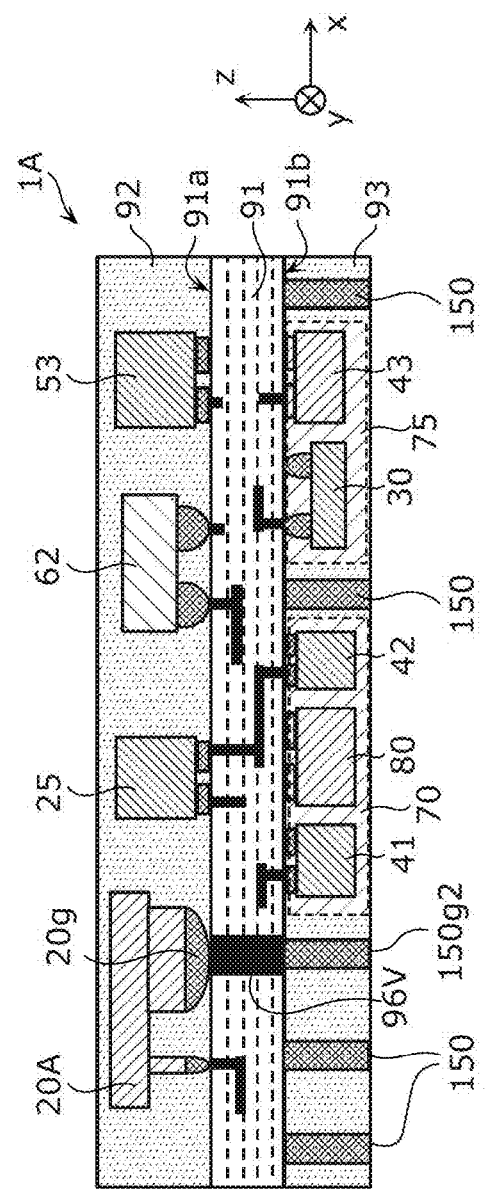
FIG. 3C is a second schematic cross-sectional view of the configuration of the radio frequency module according to the working example.

2. Disposition and Configuration of Circuit Elements of Radio Frequency Module 1A According to Working Example FIG. 3A is a schematic plan view of the configuration of radio frequency module 1A according to a working example of the embodiment. FIG. 3B is a first schematic cross-sectional view of the configuration of radio frequency module 1A according to the working example. More specifically, FIG. 3B is a cross-sectional view of radio frequency module 1A cut along IIIB-IIIB line shown in FIG. 3A. FIG. 3C is a second schematic cross-sectional view of the configuration of radio frequency module 1A according to the working example. More specifically, FIG. 3C is a cross-sectional view of radio frequency module 1A cut along IIIC-IIIC line shown in FIG. 3A. Note that (a) in FIG. 3A shows the layout of the circuit elements when principal surface 91a is viewed from the positive direction of the z axis, of principal surfaces 91a and 91b on the opposite sides of module board 91. (b) in FIG. 3A is a perspective view of the disposition of the circuit elements when principal surface 91b is viewed from the positive direction of the z axis.

Radio frequency module 1A according to the working example is an embodiment that shows concrete disposition and configuration of the circuit elements included in radio frequency module 1 according to the embodiment.

As shown in FIG. 3A, FIG. 3B, and FIG. 3C, radio frequency module 1A according to the working example further includes module board 91, resin members 92 and 93, and a plurality of external-connection terminals 150 in addition to the circuit elements shown in FIG. 1.

Module board 91, which includes principal surface 91a (first principal surface) and principal surface 91b (second principal surface) on the opposite sides of the module board, is a board on which the transmission circuit and reception circuit described above are mounted. Non-limiting examples of module board 91 to be used include: a low temperature co-fired ceramics (LTCC) board including stacked dielectric layers; a high temperature co-fired ceramics (HTCC) board including stacked dielectric layers; a component-embedded board; a board having a redistribution layer (RDL); and a printed circuit board.

Resin member 92 is disposed on principal surface 91a of module board 91. Resin member 92 covers part of the transmission circuit, part of the reception circuit, and principal surface 91a of module board 91. Resin member 92 is capable of ensuring the reliability of circuit elements included in the transmission circuit and the reception circuit covered with resin member 92, such the mechanical strength and humidity resistance of such circuit elements. Resin member 93 is disposed on principal surface 91b of module board 91. Resin member 93 covers part of the transmission circuit, part of the reception circuit, and principal surface 91b of module board 91. Resin member 93 is capable of ensuring the reliability of circuit elements included in the transmission circuit and the reception circuit covered with resin member 93, such the mechanical strength and humidity resistance of such circuit elements. Note that resin members 92 and 93 are not essential structural elements of the radio frequency module according to the present disclosure.

As shown in FIG. 3A, FIG. 3B, and FIG. 3C, in radio frequency module 1A according to the working example, power amplifiers 10A and 20A, output transformers 15 and 25, duplexers 61, 62, and 63, and matching circuits 51, 52, 53, and 54 are disposed on principal surface 91a (first principal surface) of module board 91. Meanwhile, PA control circuit 80, low-noise amplifier 30, and switches 41, 42, 43, and 44 are disposed on principal surface 91b (second principal surface) of module board 91.

Although not illustrated in FIG. 3A, transmission lines implemented as transmission paths AT, BT, and CT, and reception paths AR, BR, and CR shown in FIG. 1 are located inside of module board 91, and on principal surfaces 91a and 91b. Such lines may be bonding wires, both ends of which are bonded to principal surfaces 91a and 91b, and any one of circuit elements included in radio frequency module 1A. Alternatively, the lines may be terminals, electrodes, or wirings located on the surfaces of circuit elements included in radio frequency module 1A.

In the present working example, power amplifiers 10A and 20A are disposed on principal surface 91a (first principal surface). Power amplifier 10A is an example of the first power amplifier that amplifies transmission signals in the first frequency range that includes communication bands A and B. Power amplifier 20A is an example of the second power amplifier that amplifies transmission signals in the second frequency range that includes communication band C. In the present working example, the first frequency range (communication band A and B) is lower than the second frequency range (commination band C).

A plurality of external-connection terminals 150 are disposed at the side of principal surface 91b (second principal surface) of module board 91. Radio frequency module 1A transmits and receives electrical signals, via a plurality of external-connection terminals 150, to and from an external board in a position that is in the negative direction of the z axis of radio frequency module 1A. As shown in (b) in FIG. 3A, a plurality of external-connection terminals 150 include antenna connection terminal 100, transmission input terminals 111, 112, 121, and 122, reception output terminal 130, and control signal terminal 140. Some of external-connection terminals 150 are set at ground potential of the external board.

As shown in FIG. 3A, FIG. 3B, and FIG. 3C, radio frequency module 1A includes via-conductors 95V and 96V.

Via-conductor 95V, which is an example of the first via-conductor, is located inside of module board 91 to connect principal surface 91a and principal surface 91b. Via-conductor 96V, which is an example of the second via-conductor, is located inside of module board 91 to connect principal surface 91a and principal surface 91b. Via-conductor 95V and via-conductor 96V are spaced apart from each other inside of module board 91.

Figure 4:
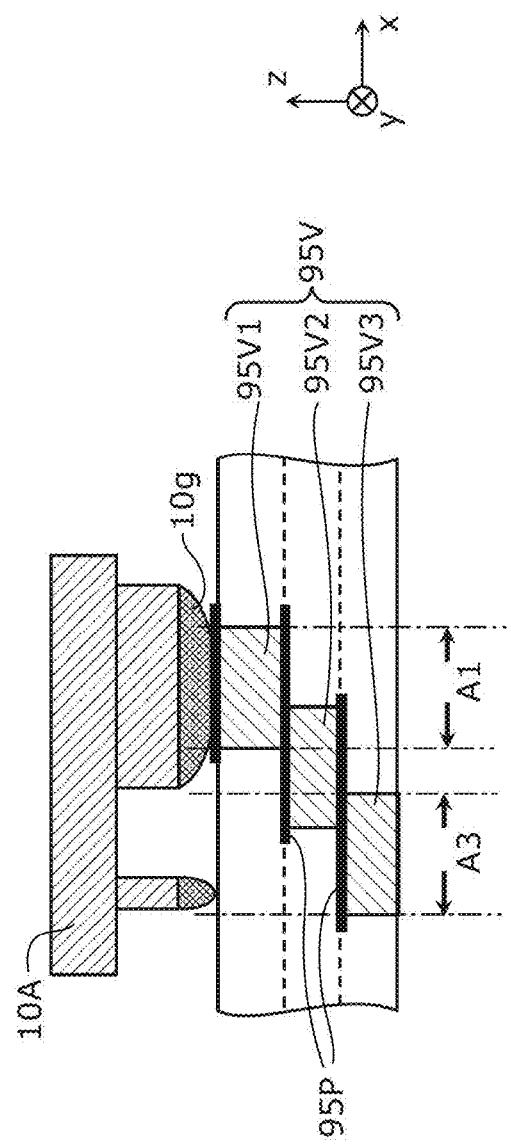
FIG. 4 is a schematic cross-sectional view of a detailed configuration of a via-conductor of the radio frequency module according to the working example.

FIG. 4 is a schematic cross-sectional view of a detailed configuration of via-conductor 95V of the radio frequency module according to the working example. As shown in the drawing, via-conductor 95V includes a plurality of columnar conductors 95V1 (first columnar conductor), 95V2 (first columnar conductor), and 95V3 (first columnar conductor) that extend and are cascaded in the normal direction that is normal to principal surfaces 91a and 91b with the central axes of these columnar conductors being displaced in the normal direction. Further, on module board 91, region A1 of columnar conductor 95V1 that is disposed in the furthest position in the positive direction of the z axis does not overlap region A3 of columnar conductor 95V3 that is disposed in the furthest position in the negative direction of the z axis in a plan view of module board 91. Stated differently, in a plan view of module board 91, via-conductor 95V has no region in which columnar conductors 95V1 through 95V3 overlap each other. Note that columnar conductor 95V1 and columnar conductor 95V2 are connected by way of conductor trace 95P that extends inside of module board 91 in the y axis direction. Also, columnar conductor 95V2 and columnar conductor 95V3 are connected by way of conductor trace 95P that extends inside of module board 91 in the y axis direction.

Also, as shown in FIG. 3B, one end of columnar conductor 95V1 is connected, on principal surface 91a, to ground electrode 10g (first ground electrode) of power amplifier 10A, and one end of columnar conductor 95V3 is connected, on principal surface 91b, to external-connection terminal 150g1 (first external-connection terminal) that is set at ground potential among a plurality of external-connection terminals 150. Note that the number of columnar conductors included in via-conductor 95V according to the present working example is simply required be at least one.

Via-conductor 96V, which is an example of the second via-conductor, is located inside of module board 91 to connect principal surface 91a and principal surface 91b.

As shown in FIG. 3C, one end of via-conductor 96V is connected, on principal surface 91a, to ground electrode 20g (second ground electrode) of power amplifier 20A, and the other end of via-conductor 96V is connected, on principal surface 91b, to external-connection terminal 150g2 (second external-connection terminal) that is set at ground potential among a plurality of external-connection terminals 150.

Via-conductor 96V penetrates module board 91 in the normal direction of principal surfaces 91a and 91b.

Power amplifiers 10A and 20A are ones of the circuit components of radio frequency module 1A that generate a great amount of heat. To improve the heat dissipation of radio frequency module 1A, it is important to dissipate heat generated by power amplifiers 10A and 20A to the external board via heat dissipation paths having low heat resistance. If power amplifiers 10A and 20A were mounted on principal surface 91b, the electrode wiring connected to power amplifiers 10A and 20A would be disposed on principal surface 91b. As such, radio frequency module 1A would include a heat dissipation path that runs only through a planar wiring trace (located along the xy planar direction) on principal surface 91b. Such planar wiring trace includes a thin metal film, and thus has high heat resistance. For this reason, power amplifiers 10A and 20A disposed on principal surface 91b would result in the degradation in the heat dissipation properties.

To cope with this, as shown in FIG. 3B, radio frequency module 1A according to the present working example further includes via-conductor 95V for heat dissipation that is connected, on principal surface 91a, to ground electrode 10g of power amplifier 10A and that extends from principal surface 91a to principal surface 91b. Also, as shown in FIG. 3C, radio frequency module 1A according to the present working example further includes via-conductor 96V for heat dissipation that is connected, on principal surface 91a, to ground electrode 20g of power amplifier 20A and that extends from principal surface 91a to principal surface 91b. Via-conductor 95V is connected, on principal surface 91b, to external-connection terminal 150g1 set at ground potential, and via-conductor 96V is connected, on principal surface 91b, to external-connection terminal 150g2 set at ground potential.

This configuration enables power amplifier 10A and external-connection terminal 150g1 to be connected by way of via-conductor 95V for heat dissipation, and enables power amplifier 20A and external-connection terminal 150g2 to be connected by way of via-conductor 96V for heat dissipation. This configuration, in which via-conductor 95V and via-conductor 96V are spaced apart from each other inside of module board 91, prevents heat from being transferred between power amplifier 10A and power amplifier 20A. If via-conductor 95V and via-conductor 96V were bonded with each other inside of module board 91, heat would flow by way of via-conductors 95V and 96V from one of the two power amplifiers that generates a greater amount of heat into the other of the power amplifiers that generates a smaller amount of heat. This would result in the degradation in the amplification properties of the power amplifier that generates a smaller amount of heat. In particular, via-conductor 95V, which penetrates module board 91 in the normal direction of principal surfaces 91a and 91b, has an extremely low heat resistance, and thus is capable of efficient dissipation of heat generated by power amplifier 10A to outside of radio frequency module 1A via an independent heat dissipation path. The present disclosure with the above configuration is thus capable of providing a small-sized radio frequency module 1A having enhanced properties of dissipating heat generated by power amplifiers 10A and 20A to the external board, while reducing heat transfer between the power amplifiers inside of the module.

Note that in the present working example, the first frequency range (communication bands A and B) is lower than the second frequency range (communication band C). For this reason, power amplifier 20A that amplifies transmission signals in the second frequency range (communication band C) tends to generate a greater amount of heat than power amplifier 10A that amplifies transmission signals in the first frequency range (communication bands A and B). In view of this, in radio frequency module 1A according to the present working example, via-conductor 96V connected to power amplifier 20A is located to penetrate module board 91 in the normal direction of principal surfaces 91a and 91b, and via-conductor 95V is located to have no region in which columnar conductors 95V1 through 95V3 overlap each other in a plan view of module board 91.

In via-conductor 95V and via-conductor 96V with the above configurations, heat resistance of via-conductor 96V in a heat dissipation path from principal surface 91a to principal surface 91b is lower than that of via-conductor 95V. Stated differently, a higher heat dissipation efficiency is granted to power amplifier 20A that tends to generate a greater amount of heat than power amplifier 10A. As such, this configuration is capable of achieving an efficient, well-balanced heat dissipation between two power amplifiers 10A and 20A.

Note that in the present working example, via-conductor 96V that penetrates module board 91 in the normal direction of principal surfaces 91a and 91b refers to not only a single conductor having a columnar or prismatic columnar shape located along the above normal direction, but also to a via-conductor having a shape described below. Stated differently, via-conductor 96V may also include a plurality of columnar conductors that extend and are cascaded in the normal direction of principal surfaces 91a and 91b and that have a region in which a plurality of columnar conductors overlap one another in a plan view of module board 91. This configuration, in which a plurality of columnar conductors share an overlapped region, achieves an extremely low heat resistance, and is thus also capable of efficient dissipation of heat generated by power amplifier 20A to outside of radio frequency module 1A.

Also, in radio frequency module 1A according to the present working example, as shown in (a) in FIG. 3A, the region in which ground electrode 20g is located on principal surface 91a may incorporate the region in which via-conductor 96V is located in a plan view of module board 91.

This configuration maximizes the area in which ground electrode 20g of power amplifier 20A and via-conductor 96V contact each other, thereby lowering the heat resistance at such contact surface. This configuration is thus capable of maintaining high heat dissipation properties of being able to dissipate heat generated by power amplifier 20A to the external board.

In (a) in FIG. 3A, the region in which ground electrode 10g is located on principal surface 91a incorporates the region in which via-conductor 95V1 is located in a plan view of module board 91, but the region in which ground electrode 10g is located may not incorporate the region in which via-conductor 95V1 is located.

Also, power amplifier 10A and power amplifier 20A may be integrated in a single semiconductor IC. This configuration achieves the downsizing of transmission amplification circuits, and enables efficient dissipation of heat generated by power amplifier 10A and heat generated by power amplifier 20A to outside of radio frequency module 1A via independent heat dissipation paths.

Also, power amplifier 10A may include a plurality of cascaded first amplification elements. In this case, ground electrode 10g connected to via-conductor 95V may be connected to one of the plurality of first amplification elements that is disposed at the last stage of the first amplification elements.

In this configuration, via-conductor 95V is connected to the first amplification element at the last stage that generates the largest amount of heat of all the first amplification elements. This configuration thus enables efficient dissipation of heat generated by power amplifier 10A to outside of radio frequency module 1A.

Also, power amplifier 20A may include a plurality of cascaded second amplification elements. In this case, ground electrode 20g connected to via-conductor 96V may be connected to one of the plurality of second amplification elements that is disposed at the last stage of the second amplification elements.

In this configuration, via-conductor 96V is connected to the second amplification element at the last stage that generates the largest amount of heat of all the second amplification elements. This configuration thus enables efficient dissipation of heat generated by power amplifier 20A to outside of radio frequency module 1A.

Also, in radio frequency module 1A according to the present working example, PA control circuit 80 is mounted on principal surface 91b (second principal surface).

In this configuration, power amplifiers 10A and 20A, and PA control circuit 80 that controls power amplifiers 10A and 20A are mounted dispersedly on both principal surfaces. This configuration thus achieves the downsizing of radio frequency module 1A. Also, PA control circuit 80 through which a digital control signal is input and output is disposed across module board 91 from power amplifiers 10A and 20A. This configuration thus prevents power amplifiers 10A and 20A from receiving digital noise. This configuration is thus capable of reducing the degradation in the signal quality of radio frequency signals output from power amplifiers 10A and 20A.

Also, in radio frequency module 1A according to the present working example, switch 42 is mounted on principal surface 91b (second principal surface).

In this configuration, power amplifiers 10A and 20A, and switch 42 through which output signals of power amplifiers 10A and 20A pass are mounted dispersedly on both principal surfaces. This configuration thus achieves the downsizing of radio frequency module 1A. Also, switch 42 having OFF capacitance between the common terminal and a selection terminal not connected is disposed across module board 91 from power amplifiers 10A and 20A. This configuration prevents transmission signals output from power amplifiers 10A and 20A from leaking into a non-connected transmission path or reception path because of the OFF capacitance. This configuration is thus capable of reducing the degradation in the signal quality of radio frequency signals output from power amplifiers 10A and 20A.

Also, in radio frequency module 1A according to the present working example, switch 41 is mounted on principal surface 91b (second principal surface).

In this configuration, power amplifiers 10A and 20A, and switch 41 through which input signals into power amplifiers 10A and 20A pass are mounted dispersedly on both principal surfaces. This configuration thus achieves the downsizing of radio frequency module 1A. Also, switch 41 having OFF capacitance between the common terminal and a selection terminal not connected is disposed across module board 91 from power amplifiers 10A and 20A. This configuration prevents transmission signals input from the transmission input terminals from leaking into a non-connected power amplifier because of the OFF capacitance. This configuration is thus capable of reducing the degradation in the signal quality of radio frequency signals output from power amplifiers 10A and 20A.

Also, in radio frequency module 1A according to the present working example, PA control circuit 80, and switches 41 and 42 may be included in a single semiconductor IC 70, and semiconductor IC 70 may be disposed on principal surface 91b.

In this configuration, PA control circuit 80, and switches 41 and 42 that are connected to transmission amplification circuits 10 and 20 are located in proximity to one another. This configuration thus achieves the downsizing of radio frequency module 1A. This configuration also enables the reduction in the control wiring that connects PA control circuit 80 and switch 41 and the control wiring that connects PA control circuit 80 and switch 42. This configuration thus prevents the generation of noise from these control wirings. Note that semiconductor IC 70 may not include at least one of switch 41 or 42.

Also, as shown in FIG. 3A, in radio frequency module 1A according to the present working example, power amplifier 10A and semiconductor IC 70 at least partially overlap, and power amplifier 20A and semiconductor IC 70 do not overlap in a plan view of module board 91.

In this configuration, semiconductor IC 70 is not disposed in the region on principal surface 91b that is opposite to the region of power amplifier 20A that generates a larger amount of heat than power amplifier 10A. This configuration enables the region immediately below power amplifier 20A (at the side of the negative direction of the z axis) to be utilized as a heat dissipation region, using via-conductor 96V that penetrates module board 91 in the normal direction of principal surfaces 91a and 91b. Also, this configuration prevents the properties of PA control circuit 80, and switches 41 and 42 from being degraded by heat generated by power amplifier 20A.

Meanwhile, semiconductor IC 70 is disposed in the region on principal surface 91b that is opposite to the region of power amplifier 10A. This configuration enables a peripheral region, which is not the region immediately below power amplifier 10A (at the side of the negative direction of the z axis), to be utilized as a heat dissipation region, using via-conductor 95V that is located to have no region in which columnar conductors 95V1 through 95V3 overlap one another.

Stated differently, the region, on principal surface 91b, immediately below power amplifier 20A that generates a great amount of heat is utilized as a heat dissipation region, and the region, on principal surface 91b, immediately below power amplifier 10A that generates a small amount of heat is utilized as a region in which semiconductor IC 70 and other electronic components are disposed. This configuration is thus capable of providing a small-sized radio frequency module 1A having enhanced heat dissipation properties.

Also, in radio frequency module 1A according to the present working example, low-noise amplifier 30 is disposed on principal surface 91b (second principal surface). Here, in a plan view of module board 91, external-connection terminals 150 set at ground potential are disposed between semiconductor IC 70 and low-noise amplifier 30.

In this configuration, a plurality of external-connection terminals 150 serving as ground electrodes are disposed between low-noise amplifier 30, which greatly affects the receiving sensitivity of the reception circuit, and PA control circuit 80, through which a digital control signal is input and output. This configuration thus prevents the receiving sensitivity from being degraded by digital noise. Also, power amplifiers 10A and 20A that amplify transmission signals, and low-noise amplifier 30 that amplifies reception signals are disposed on different principal surfaces, thereby improving the isolation between transmission and reception.

Also, in radio frequency module 1A according to the present working example, low-noise amplifier 30, and switches 43 and 44 are included in a single semiconductor IC 75, and semiconductor IC 75 is disposed on principal surface 91b. In this configuration, low-noise amplifier 30, and switches 43 and 44 that are disposed in the reception path are located in proximity to each other. This configuration thus achieves the downsizing of radio frequency module 1A. Note that semiconductor IC 75 may not include at least one of switch 43 or switch 44.

Also, in radio frequency module 1A according to the present working example, output transformers 15 and 25, duplexers 61 through 63, and matching circuits 51 through 54 are mounted on principal surface 91a (first principal surface), but may be mounted on principal surface 91b (second principal surface). Also, PA control circuit 80, low-noise amplifier 30, and switches 41 through 44 are mounted on principal surface 91b (second principal surface), but may be mounted on principal surface 91a (first principal surface).

Also note that module board 91 may have a multilayer structure in which a plurality of dielectric layers are stacked, and a ground electrode trace may be located in at least one of such dielectric layers. This configuration improves the capability of shielding the electromagnetic field of module board 91.

Also, in radio frequency module 1A according to the present working example, output transformers 15 and 25 are disposed on principal surface 91a, but may be disposed on principal surface 91b or may be included inside of module board 91. In the case where output transformers 15 and 25 are included inside of module board 91, inductors included in output transformers 15 and 25 are planar coils implemented, for example, as conductive traces of module board 91. When output transformers 15 and 25 are disposed and configured in the above manner, power amplifiers 10A and 20A may not overlap output transformers 15 and 25 in a plan view of module board 91.

Output transformers 15 and 25 require high Q-values to support high-power transmission signals. For this reason, the electromagnetic fields formed by output transformers 15 and 25 may not be affected by power amplifiers 10A and 20A being located in proximity to output transformers 15 and 25. Power amplifiers 10A and 20A that are not located in the above region contribute to maintaining high Q-values of the inductors included in output transformers 15 and 25.

Note that output transformer 15 is a transformer that transfers a lower-frequency transmission signal than is transferred by output transformer 25, and thus output transformer 15 is larger than output transformer 25.

Figure 5:
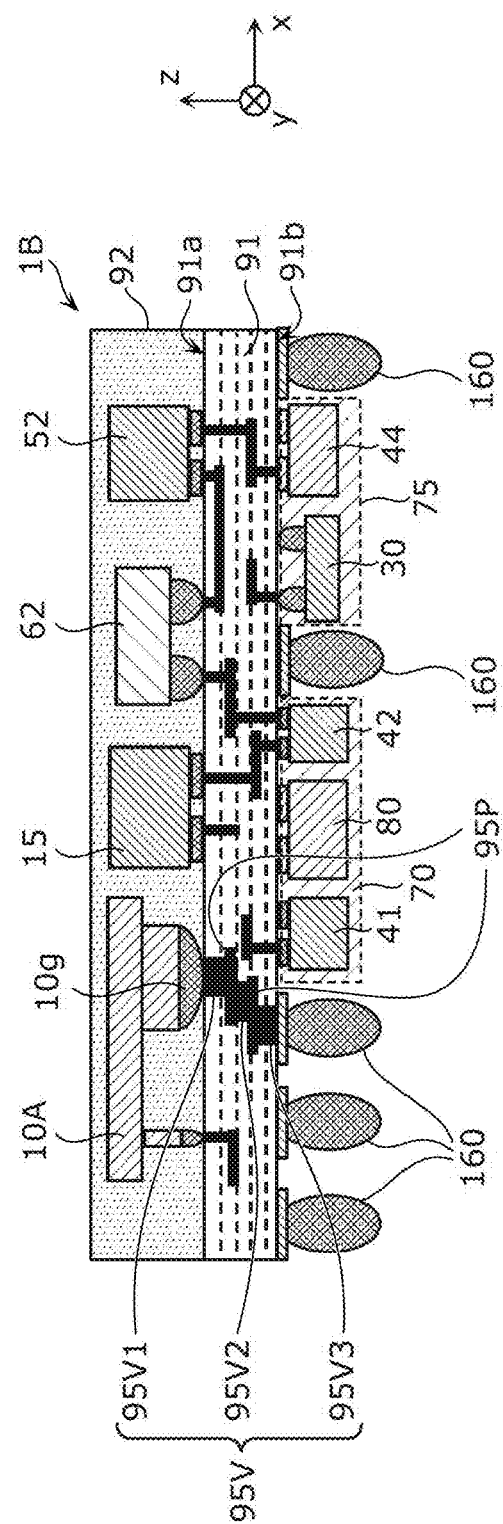
FIG. 5 is a schematic cross-sectional view of the configuration of a radio frequency module according to a variation of the embodiment.

Note that as shown in FIG. 3A through FIG. 3C, external-connection terminals 150 may be columnar electrodes that penetrate resin member 93 in the z axis direction. Alternatively, as shown in FIG. 5, external-connection terminals 150 may be bump electrodes 160 that are located on principal surface 91b as in radio frequency module 1B according to a variation of the embodiment. In this case, resin member 93 at the side of principal surface 91b may not be present.

Also, in radio frequency module 1A according to the present working example, the first frequency range (communication bands A and B) may be lower than the second frequency range (communication band C).

3. Effects, Etc

As described above, radio frequency module 1 according to the embodiment includes: module board 91 including principal surface 91a and principal surface 91b on opposite sides of module board 91; power amplifier 10A that is disposed on principal surface 91a and amplifies a transmission signal in a first frequency range; power amplifier 20A that is disposed on principal surface 91a and amplifies a transmission signal in a second frequency range that is different from the first frequency range; a plurality of external-connection terminals 150 disposed on principal surface 91b; and via-conductors 95V and 96V located inside of module board 91 and connecting principal surfaces 91a and 91b. In radio frequency module 1, via-conductor 95V and via-conductor 96V are spaced apart from each other inside of module board 91. One of ends of via-conductor 95V is connected, on principal surface 91a, to ground electrode 10g of power amplifier 10A, and a remaining one of the ends of the via-conductor 95V is connected, on principal surface 91b, to external-connection terminal 150g1 set at ground potential. One of ends of via-conductor 96V is connected, on principal surface 91a, to ground electrode 20g of power amplifier 20A, and a remaining one of the ends of via-conductor 96V is connected, on principal surface 91b, to external-connection terminal 150g2 set at ground potential. Via-conductor 96V penetrates module board 91 in a normal direction that is normal to principal surface 91a, and via-conductor 95V includes a plurality of columnar conductors 95V1, 95V2, and 95V3 extending in the normal direction of principal surface 91a and has no region in which the plurality of columnar conductors 95V1, 95V2, and 95V3 overlap each other in a plan view of module board 91, the plurality of columnar conductors 95V1, 95V2, and 95V3 being cascaded with central axes of the plurality of columnar conductors 95V1, 95V2, and 95V3 being displaced in the normal direction.

This configuration enables power amplifier 10A and external-connection terminal 150g1 to be connected by way of via-conductor 95V, and enables power amplifier 20A and external-connection terminal 150g2 to be connected by way of via-conductor 96V. This configuration eliminates a heat dissipation path that has a high heat resistance and that runs only through a planar wiring trace located along the xy planar direction, among the traces inside of module board 91. This configuration, in which via-conductor 95V and via-conductor 96V are spaced apart from each other inside of module board 91, prevents heat from being transferred between power amplifier 10A and power amplifier 20A. Via-conductor 96V, which penetrates module board 91 in the normal direction of principal surfaces 91a and 91b, has an extremely low heat resistance, and thus is capable of efficient dissipation of heat generated by power amplifier 20A to outside of radio frequency module 1 via an independent heat dissipation path. This configuration is thus capable of providing a small-sized radio frequency module 1 having an enhanced capability of being able to dissipate heat from power amplifiers 10A and 20A to the external board.

Also, the first frequency range may be lower than the second frequency range.

Power amplifier 20A that amplifies transmission signals in the second frequency range (communication band C) generates a greater amount of heat than power amplifier 10A that amplifies transmission signals in the first frequency range (communication bands A and B). In view of this, in via-conductor 95V and via-conductor 96V with the above configurations, heat resistance of via-conductor 96V in a heat dissipation path from principal surface 91a to principal surface 91b is lower than that of via-conductor 95V. Stated differently, a higher heat dissipation efficiency is granted to power amplifier 20A that tends to generate a greater amount of heat than power amplifier 10A. As such, this configuration is capable of achieving an efficient, well-balanced heat dissipation between two power amplifiers 10A and 20A.

Also, in radio frequency module 1, in the plan view of module board 91, a region, on principal surface 91a, in which ground electrode 20g is located may incorporate a region in which via-conductor 96V is located.

This configuration maximizes the area in which ground electrode 20g of power amplifier 20A and via-conductor 96V contact each other, thereby lowering the heat resistance at such contact surface. This configuration is thus capable of maintaining high heat dissipation properties of being able to dissipate heat generated by power amplifier 20A to the external board.

Also, in radio frequency module 1, power amplifier 10A and power amplifier 20A may be included in a single first semiconductor integrated IC.

This configuration achieves the downsizing of transmission amplification circuits, and enables efficient dissipation of heat generated by power amplifier 10A and heat generated by power amplifier 20A to outside of radio frequency module 1 via independent heat dissipation paths.

Also, in radio frequency module 1, power amplifier 10A may include a plurality of first amplification elements that are cascaded with each other, power amplifier 20A may include a plurality of second amplification elements that are cascaded with each other, ground electrode 10g may be connected to one of the plurality of first amplification elements that is disposed at a last stage of the plurality of first amplification elements, and ground electrode 20g may be connected to one of the plurality of second amplification elements that is disposed at a last stage of the plurality of second amplification elements.

In this configuration, via-conductor 95V is connected to the first amplification element at the last stage that generates the largest amount of heat of all the first amplification elements. This configuration thus enables efficient dissipation of heat generated by power amplifier 10A to outside of radio frequency module 1. Also, in this configuration, via-conductor 96V is connected to the second amplification element at the last stage that generates the largest amount of heat of all the second amplification elements. This configuration thus enables efficient dissipation of heat generated by power amplifier 20A to outside of radio frequency module 1.

Also, in radio frequency module 1, power amplifier 10A may include amplification elements 12 and 13, and power amplifier 20A may include amplification elements 22 and 23. Radio frequency module 1 may further include: output transformer 15 including primary side coil 15a and secondary side coil 15b; and output transformer 25 including primary side coil 25a and secondary side coil 25b. Here, one of ends of primary side coil 15a may be connected to an output terminal of amplification element 12 and a remaining one of the ends of primary side coil 15a may be connected to an output terminal of amplification element 13, and one of ends of secondary side coil 15b may be connected to an output terminal of transmission amplification circuit 10. Also, one of ends of primary side coil 25a may be connected to an output terminal of amplification element 22 and a remaining one of the ends of primary side coil 25a may be connected to an output terminal of amplification element 23, and one of ends of secondary side coil 25b may be connected to an output terminal of transmission amplification circuit 20. Power amplifier 10A and output transformer 15 may be included in transmission amplification circuit 10. Power amplifier 20A and output transformer 25 may be included in transmission amplification circuit 20. Ground electrode 10g may be connected to amplification elements 12 and 13 and ground electrode 20g may be connected to amplification elements 22 and 23. The first frequency range may be lower than the second frequency range, and output transformer 15 may be larger than output transformer 25.

This configuration, in which amplification elements 12 and 13 operate in antiphase, prevents the lowering of the power gain of transmission amplification circuit 10. Also, in this configuration, in which amplification elements 22 and 23 operate in antiphase, prevents the lowering of the power gain of transmission amplification circuit 20. Also, the non-inverted signal and the inverted signal amplified by amplification elements 12 and 13 are synthesized, and the non-inverted signal and the inverted signal amplified by amplification elements 22 and 23 are synthesized, thereby reducing unwanted waves such as, for example, radio frequency components in radio frequency module 1.

Also, radio frequency module 1 may further include: PA control circuit 80 that controls power amplifiers 10A and 20A. Here, PA control circuit 80 may be disposed on principal surface 91b.

In this configuration, power amplifiers 10A and 20A, and PA control circuit 80 that controls power amplifiers 10A and 20A are mounted dispersedly on both principal surfaces. This thus achieves the downsizing of radio frequency module 1A. This configuration is also capable of preventing power amplifiers 10A and 20A from receiving digital noise. This configuration is also capable of reducing the degradation in the signal quality of radio frequency signals output from power amplifiers 10A and 20A.

Also, radio frequency module 1 may further include: switch 42 connected to an output terminal of power amplifier 10A and an output terminal of power amplifier 20A. Here, switch 42 may be disposed on principal surface 91b.

In this configuration, power amplifiers 10A and 20A, and switch 42 through which output signals of power amplifiers 10A and 20A pass are mounted dispersedly on both principal surfaces. This thus achieves the downsizing of radio frequency module 1A. This configuration also prevents transmission signals output from power amplifiers 10A and 20A from leaking into a non-connected transmission path or reception path because of the OFF capacitance of switch 42. This configuration is thus capable of reducing the degradation in the signal quality of radio frequency signals output from power amplifiers 10A and 20A.

Also, radio frequency module 1 may further include: switch 41 connected to an input terminal of power amplifier 10A and an input terminal of power amplifier 20A. Here, switch 41 may be disposed on principal surface 91b.

In this configuration, power amplifiers 10A and 20A, and switch 41 through which input signals into power amplifiers 10A and 20A pass are mounted dispersedly on both principal surfaces. This thus achieves the downsizing of radio frequency module 1A. This configuration also prevents transmission signals input from the transmission input terminals from leaking into a non-connected power amplifier because of the OFF capacitance of switch 41. This configuration is thus capable of reducing the degradation in the signal quality of radio frequency signals output from power amplifiers 10A and 20A.

Also, in radio frequency module 1, PA control circuit 80, switch 41, and switch 42 may be included in a single semiconductor IC 70.

In this configuration, PA control circuit 80, and switches 41 and 42 are located in proximity to one another. This configuration thus achieves the downsizing of radio frequency module 1. This configuration also enables the reduction in the length of the control wiring that connects PA control circuit 80 and switch 41 and the length of the control wiring that connects PA control circuit 80 and switch 42. This thus prevents the generation of noise from these control wirings.

Also, in radio frequency module 1, in the plan view of module board 91, power amplifier 10A and semiconductor IC 70 may partially overlap each other, and power amplifier 20A and semiconductor IC 70 may not overlap each other.

In this configuration, semiconductor IC 70 is not disposed in the region on principal surface 91b that is opposite to the region of power amplifier 20A that generates a larger amount of heat than power amplifier 10A. This configuration enables the region immediately below power amplifier 20A (at the side of the negative direction of the z axis) to be utilized as a heat dissipation region, using via-conductor 96V that penetrates module board 91 in the normal direction of principal surfaces 91a and 91b. Also, this configuration prevents the properties of PA control circuit 80, and switches 41 and 42 from being degraded by heat generated by power amplifier 20A.

Meanwhile, semiconductor IC 70 is disposed in the region on principal surface 91b that is opposite to the region of power amplifier 10A. This configuration enables a peripheral region, which is not the region immediately below power amplifier 10A (at the side of the negative direction of the z axis), to be utilized as a heat dissipation region, using via-conductor 95V that is located to have no region in which columnar conductors 95V1 through 95V3 overlap one another.

Stated differently, the region, on principal surface 91b, immediately below power amplifier 20A that generates a great amount of heat is utilized as a heat dissipation region, and the region, on principal surface 91b, immediately below power amplifier 10A that generates a small amount of heat is utilized as a region in which semiconductor IC 70 and other electronic components are disposed. This configuration is thus capable of providing a small-sized radio frequency module 1 having enhanced heat dissipation properties.

Also, radio frequency module 1 may further include: low-noise amplifier 30 that is disposed on principal surface 91b. Here, in the plan view of module board 91, one of the plurality of external-connection terminals 150 that is set at ground potential may be disposed between semiconductor IC 70 and low-noise amplifier 30.

In this configuration, external-connection terminal 150 serving as a ground electrode is disposed between low-noise amplifier 30, which greatly affects the receiving sensitivity of the reception circuit, and PA control circuit 80, through which a digital control signal is input and output. This configuration thus prevents the receiving sensitivity from being degraded by digital noise. Also, power amplifiers 10A and 20A that amplify transmission signals, and low-noise amplifier 30 that amplifies reception signals are disposed on different principal surfaces, thereby improving the isolation between transmission and reception.

Also, communication device 5 includes: antenna 2; RFIC 3 that processes a radio frequency signal that is to be transmitted or has been received by antenna 2; and radio frequency module 1 that transfers the radio frequency signal between antenna 2 and RFIC 3.

This configuration provides multiband-capable communication device 5 having enhanced heat dissipation properties Another Embodiment, Etc The radio frequency module and the communication device according to the present disclosure have been described above using the embodiment, working example, and variation, but the present disclosure is not limited to the foregoing embodiment, working example, and variation. The present disclosure also includes: another embodiment achieved by freely combining structural elements in the foregoing embodiment, working example, and variation; variations achieved by making various modifications to the foregoing embodiment, working example, and variation that can be conceived by those skilled in the art without departing from the essence of the present disclosure; and various devices that include the radio frequency module and the communication device according to the present disclosure.

For example, in the radio frequency module and the communication device according to each of the foregoing embodiment, working example, and variation, another circuit element, wiring, and so forth may be interposed between circuit elements and paths connecting signal paths disclosed in the drawings.

Although only an exemplary embodiment of the present disclosure has been described in detail above, those skilled in the art will readily appreciate that many modifications are possible in the exemplary embodiment without materially departing from the novel teachings and advantages of the present disclosure. Accordingly, all such modifications are intended to be included within the scope of the present disclosure.

INDUSTRIAL APPLICABILITY

The present disclosure is widely applicable for use in communication devices (e.g., mobile phone) as a multiband-capable radio frequency module that is placed at the front-end portion.

The invention claimed is:

1. A radio frequency module, comprising:
a module board including a first principal surface and a second principal surface on opposite sides of the module board;
a first power amplifier disposed on the first principal surface and configured to amplify a transmission signal in a first frequency range;
a second power amplifier disposed on the first principal surface and configured to amplify a transmission signal in a second frequency range that is different from the first frequency range;
a plurality of external-connection terminals disposed on the second principal surface;
a first via-conductor located inside of the module board and connecting the first principal surface and the second principal surface; and
a second via-conductor located inside of the module board and connecting the first principal surface and the second principal surface,
wherein the first via-conductor and the second via-conductor are spaced apart from each other inside of the module board,
one end of the first via-conductor on the first principle surface side is connected to a first ground electrode of the first power amplifier, and a remaining end of the first via-conductor on the second principal surface side is connected to a first external-connection terminal set at ground potential, the first external-connection terminal being one of the plurality of external-connection terminals,
one end of the second via-conductor on the first principal surface side is connected to a second ground electrode of the second power amplifier, and a remaining end of the second via-conductor on the second principal surface is connected to a second external-connection terminal set at ground potential, the second external-connection terminal being one of the plurality of external-connection terminals,
the second via-conductor penetrates the module board in a normal direction that is normal to the first principal surface, and
the first via-conductor includes a plurality of first columnar conductors extending in the normal direction of the first principal surface and has no region in which the plurality of first columnar conductors overlap each other in a plan view of the module board, the plurality of first columnar conductors being cascaded with central axes of the plurality of first columnar conductors being displaced in the normal direction.

2. The radio frequency module according to claim 1, wherein the first frequency range is lower in frequency than the second frequency range.

3. The radio frequency module according to claim 1, wherein in the plan view of the module board, a region, on the first principal surface, in which the second ground electrode is located incorporates a region in which the second via-conductor is located.

4. The radio frequency module according to claim 1, wherein the first power amplifier and the second power amplifier are included in a single first semiconductor integrated circuit (IC).

5. The radio frequency module according to claim 1, wherein the first power amplifier includes a plurality of first amplification elements that are cascaded with each other,
the second power amplifier includes a plurality of second amplification elements that are cascaded with each other,
the first ground electrode is connected to one of the plurality of first amplification elements that is disposed at a last stage of the plurality of first amplification elements, and
the second ground electrode is connected to one of the plurality of second amplification elements that is disposed at a last stage of the plurality of second amplification elements.

6. The radio frequency module according to claim 1, wherein the first power amplifier includes a third amplification element and a fourth amplification element,
the second power amplifier includes a fifth amplification element and a sixth amplification element, and
the radio frequency module further comprises:
a first output transformer including a first coil and a second coil; and
a second output transformer including a third coil and a fourth coil,
the first power amplifier and the first output transformer are included in a first transmission amplification circuit,
the second power amplifier and the second output transformer are included in a second transmission amplification circuit,
one end of the first coil is connected to an output terminal of the third amplification element and a remaining end of the first coil is connected to an output terminal of the fourth amplification element, and one end of the second coil is connected to an output terminal of the first transmission amplification circuit,
one end of the third coil is connected to an output terminal of the fifth amplification element and a remaining end of the third coil is connected to an output terminal of the sixth amplification element, and one end of the fourth coil is connected to an output terminal of the second transmission amplification circuit,
the first ground electrode is connected to the third amplification element and the fourth amplification element,
the second ground electrode is connected to the fifth amplification element and the sixth amplification element,
the first frequency range is lower than the second frequency range, and
the first output transformer is larger than the second output transformer.

7. The radio frequency module according to claim 1, further comprising:
a control circuit configured to control the first power amplifier and the second power amplifier,
wherein the control circuit is disposed on the second principal surface.

8. The radio frequency module according to claim 1, further comprising:
a first switch connected to an output terminal of the first power amplifier and an output terminal of the second power amplifier,
wherein the first switch is disposed on the second principal surface.

9. The radio frequency module according to claim 1, further comprising:
a second switch connected to an input terminal of the first power amplifier and an input terminal of the second power amplifier,
wherein the second switch is disposed on the second principal surface.

10. The radio frequency module according to claim 1, further comprising:
a control circuit configured to control the first power amplifier and the second power amplifier;
a first switch connected to an output terminal of the first power amplifier and an output terminal of the second power amplifier; and
a second switch connected to an input terminal of the first power amplifier and an input terminal of the second power amplifier,
wherein the control circuit, the first switch, and the second switch are included in a single second semiconductor IC, and
the single second semiconductor IC is disposed on the second principal surface.

11. The radio frequency module according to claim 10, wherein in the plan view of the module board,
the first power amplifier and the single second semiconductor IC partially overlap each other, and
the second power amplifier and the single second semiconductor IC do not overlap each other.

12. The radio frequency module according to claim 10, further comprising:
a low-noise amplifier disposed on the second principal surface and configured to amplify a reception signal,
wherein in the plan view, one of the plurality of external-connection terminals that is set at ground potential is disposed between the single second semiconductor IC and the low-noise amplifier.

13. A communication device, comprising:
an antenna;
a radio frequency (RF) signal processing circuit configured to process a radio frequency signal that is to be transmitted or has been received by the antenna; and
a radio frequency module configured to transfer the radio frequency signal between the antenna and the RF signal processing circuit, the radio frequency module including
a module board including a first principal surface and a second principal surface on opposite sides of the module board,
a first power amplifier disposed on the first principal surface and configured to amplify a transmission signal in a first frequency range,
a second power amplifier disposed on the first principal surface and configured to amplify a transmission signal in a second frequency range that is different from the first frequency range,
a plurality of external-connection terminals disposed on the second principal surface,
a first via-conductor located inside of the module board and connecting the first principal surface and the second principal surface, and
a second via-conductor located inside of the module board and connecting the first principal surface and the second principal surface,
wherein the first via-conductor and the second via-conductor are spaced apart from each other inside of the module board, one end of the first via-conductor on the first principle surface side is connected to a first ground electrode of the first power amplifier, and a remaining end of the first via-conductor on the second principal surface side is connected to a first external-connection terminal set at ground potential, the first external-connection terminal being one of the plurality of external-connection terminals,
one end of the second via-conductor on the first principal surface side is connected to a second ground electrode of the second power amplifier, and a remaining end of the second via-conductor on the second principal surface is connected to a second external-connection terminal set at ground potential, the second external-connection terminal being one of the plurality of external-connection terminals,
the second via-conductor penetrates the module board in a normal direction that is normal to the first principal surface, and
the first via-conductor includes a plurality of first columnar conductors extending in the normal direction of the first principal surface and has no region in which the plurality of first columnar conductors overlap each other in a plan view of the module board, the plurality of first columnar conductors being cascaded with central axes of the plurality of first columnar conductors being displaced in the normal direction.

14. The communication device to claim 13,
wherein the first frequency range is lower in frequency than the second frequency range.

15. The communication device according to claim 13,
wherein in the plan view of the module board, a region, on the first principal surface, in which the second ground electrode is located incorporates a region in which the second via-conductor is located.

16. The communication device according to claim 13,
wherein the first power amplifier and the second power amplifier are included in a single first semiconductor integrated circuit (IC).

17. The communication device according to claim 13,
wherein the first power amplifier includes a plurality of first amplification elements that are cascaded with each other,
the second power amplifier includes a plurality of second amplification elements that are cascaded with each other,
the first ground electrode is connected to one of the plurality of first amplification elements that is disposed at a last stage of the plurality of first amplification elements, and
the second ground electrode is connected to one of the plurality of second amplification elements that is disposed at a last stage of the plurality of second amplification elements.

18. The communication device according to claim 13,
wherein the first power amplifier includes a third amplification element and a fourth amplification element,
the second power amplifier includes a fifth amplification element and a sixth amplification element, and
the radio frequency module further comprises:
a first output transformer including a first coil and a second coil; and
a second output transformer including a third coil and a fourth coil,
the first power amplifier and the first output transformer are included in a first transmission amplifier circuit, the second power amplifier and the second output transformer are included in a second transmission amplifier circuit, one end of the first coil is connected to an output terminal of the third amplification element and a remaining end of the first coil is connected to an output terminal of the fourth amplification element, and one end of the second coil is connected to an output terminal of the first transmission amplification circuit, one end of the third coil is connected to an output terminal of the fifth amplification element and a remaining end of the third coil is connected to an output terminal of the sixth amplification element, and one end of the fourth coil is connected to an output terminal of the second transmission amplification circuit, the first ground electrode is connected to the third amplification element and the fourth amplification element, the second ground electrode is connected to the fifth amplification element and the sixth amplification element, the first frequency range is lower than the second frequency range, and the first output transformer is larger than the second output transformer.

19. The communication device according to claim 13, wherein the radio frequency module further comprises a control circuit configured to control the first power amplifier and the second power amplifier, and the control circuit is disposed on the second principal surface.

20. The communication device according to claim 13, wherein the radio frequency module further comprises a first switch connected to an output terminal of the first power amplifier and an output terminal of the second power amplifier, and the first switch is disposed on the second principal surface.

* * * * *